ized Patent [19]

Onodera

[11] 3,987,378
[45] Oct. 19, 1976

[54] SURFACE WAVE APPARATUS
[75] Inventor: Toshihiro Onodera, Kawasaki, Japan
[73] Assignee: Tokyo Shibaura Electric Co., Ltd., Kawasaki, Japan
[22] Filed: Mar. 5, 1975
[21] Appl. No.: 555,625

[30] Foreign Application Priority Data
Mar. 8, 1974  Japan................................ 49-26240
Mar. 8, 1974  Japan................................ 49-26241
Mar. 8, 1974  Japan................................ 49-26242
Mar. 8, 1974  Japan................................ 49-26243
Mar. 8, 1974  Japan................................ 49-26244

[52] U.S. Cl. ............................ 333/30 R; 310/9.3; 310/9.8; 333/72
[51] Int. Cl.² .................... H03H 9/06; H03H 9/26; H03H 9/32; H03H 9/30
[58] Field of Search.............. 333/72, 30 R; 310/8, 310/8.1, 8.2, 8.3, 9.1–9.3, 9.7, 9.8

[56] References Cited
UNITED STATES PATENTS
3,360,749  12/1967  Sittig .................................. 310/8 X
3,665,225  5/1972  Van Den Heuvel et al. ......... 310/8.1
3,684,970  8/1972  Wang ............................ 333/30 R X
3,786,373  1/1974  Schulz et al. ........................ 310/9.8
3,818,382  6/1974  Holland et al. ................. 333/30 R X OTHER PUBLICATIONS
Van Den Heuvel et al., — "The Hybrid Transducer" Paper C-8, IEEE Ultrasonics Symposium St. Louis, Mo. Sept. 24–26, 1969, pp. 1–8.

Primary Examiner—Archie R. Borchelt
Assistant Examiner—Marvin Nussbaum
Attorney, Agent, or Firm—Cushman, Darby & Cushman

[57] ABSTRACT

A surface wave apparatus which comprises an insulation substrate having a smooth surface; a surface wave conversion interdigitated electrode evaporated on the smooth surface of the insulating substrate; a piezoelectric plate, on the smooth surface of which the insulation substrate is mounted at a prescribed space in contact with the electricity-surface wave conversion interdigitated electrode; an insulation liquid layer provided between the smooth surface of the piezoelectric plate and the electricity-surface wave conversion interdigitated electrode as well as between the smooth surface of the piezoelectric plate and the smooth surface of the insulation substrate.

6 Claims, 17 Drawing Figures

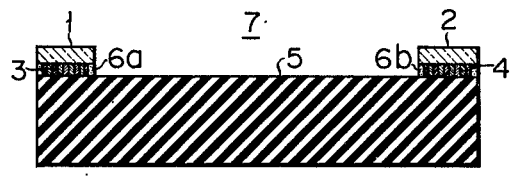
FIG. 1
FIG. 2
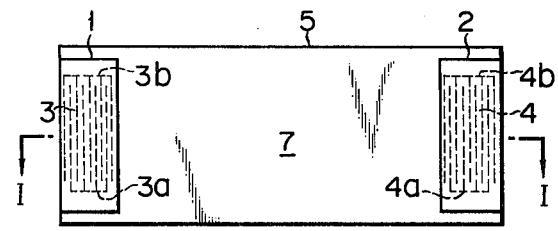
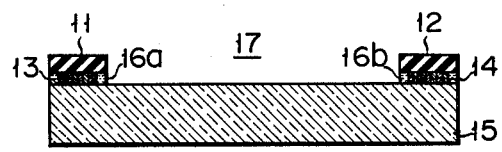
FIG. 3
FIG. 7
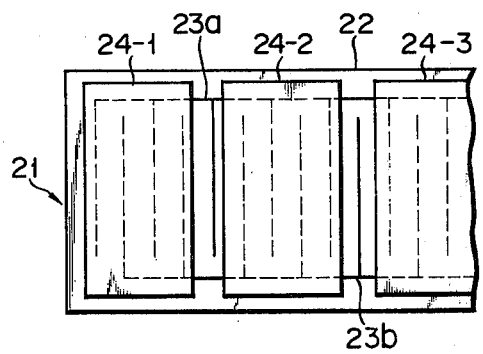

SURFACE WAVE APPARATUS

This invention relates to a surface wave apparatus. An electricity-surface wave conversion apparatus for converting an electric signal into a surface wave signal or vice versa is constructed, as set forth in, for example, the U.S. Pat. No. 3,360,749, by evaporating an electricity-surface wave conversion interdigitated electrode on a piezoelectric plate. Other proposed processes of mounting said interdigitated electrode on the piezoelectric plate include those which involve application of a synthetic adhesive such as epoxy resin and those which sputter piezoelectric material on the electricity-surface wave conversion interdigitated electrode formed on an insulation substrate. Among the proposed processes, however, that of evaporating an electricity-surface wave conversion interdigitated electrode on a piezoelectric substrate attains the most prominent electricity-surface wave conversion rate.

Further, the electricity-surface conversion efficiency of a surface wave apparatus is considerably affected also by the position occupied by an electricity-surface wave conversion interdigitated electrode. However, the above-mentioned prior art processes have the drawback that the electricity-surface wave conversion interdigitated electrode initially fixed on the piezoelectric plate can not have its position later shifted to an optimum point on the piezoelectric plate for elevation of the electricity-surface wave conversion efficiency. However, this adjustment is required from the standpoint of not only increasing the efficiency of a surface wave apparatus, but also minimizing the occurrence of a spurious mode therein.

It is accordingly the object of this invention to provide a surface wave apparatus which admits of the selection of an optimum point being occupied by the electricity-surface wave conversion interdigitated electrode on the piezoelectric plate, can be operated with high efficiency and low spurious mode and also in a fully insulated condition against a high voltage signal.

Namely, this invention provides a surface wave apparatus constructed by forming a electricity-surface wave conversion interdigitated electrode on an insulation substrate and mounting said electricity-surface wave conversion interdigitated electrode closely on a piezoelectric plate with a thin insulation liquid layer interposed therebetween. This invention is primarily characterized in that the electricity-surface wave conversion interdigitated electrode is tightly attached to the piezoelectric plate by the surface tension of an insulation liquid layer provided therebetween.

According to a aspect of this invention, there is provided a surface wave apparatus which comprises at least two first and second insulation substrates having a smooth surface; first and second electricity-surface wave conversion interdigitated electrodes formed on the first and second insulation substrates respectively; a piezoelectric plate, on the smooth surface of which the first and second insulation substrates are mounted at a prescribed space in contact with the first and second electricity-surface wave conversion interdigitated electrodes respectively; and an insulation liquid layer provided between the smooth surface of the piezoelectric plate and the first and second electricity-surface wave conversion interdigitated electrodes as well as between the piezoelectric plate and the smooth surfaces of the first and second insulation substrates, so as to enable the piezoelectric plate and the first and second electricity-surface wave conversion interdigitated electrodes to be firmly attached to each other by the surface tension of said insulation liquid layer.

According to another aspect of the invention, there is provided a surface wave apparatus which comprises an insulation substrate having a smooth surface; at least two first and second electricity-surface wave conversion interdigitated electrodes formed at a prescribed space on the smooth surface of the insulation substrate; first and second piezoelectric plates mounted on the surfaces of the first and second electricity-surface wave conversion interdigitated electrodes respectively; and an insulation liquid layer provided between the first and second piezoelectric plates and the first and second electricity-surface wave conversion interdigitated electrodes.

According to still another aspect of the invention, there is provided a surface wave apparatus which comprises an insulation substrate having a smooth surface; at least two first and second electricity-surface wave conversion interdigitated electrodes formed at a prescribed space on the smooth surface of the insulation substrate; a piezoelectric plate mounted on the insulation substrate so as to cover the first and second electricity-surface wave conversion interdigitated electrodes; and an insulation liquid layer disposed between the piezoelectric plate and the insulation substrate.

This invention can be more fully understood from the following detailed description taken in conjunction with the accompanying drawings, in which:

FIG. 1 is a cross sectional view of a surface wave apparatus according to an embodiment of this invention on line I—I of FIG. 2 as observed in the direction of the indicated arrows;

FIG. 2 is a plan view of the surface wave apparatus shown in FIG. 1;

FIG. 3 is a cross sectional view of a surface wave apparatus according to another embodiment of the invention;

FIG. 7 is a plan view of a surface wave apparatus according to still another embodiment of the invention;

Figure 4:
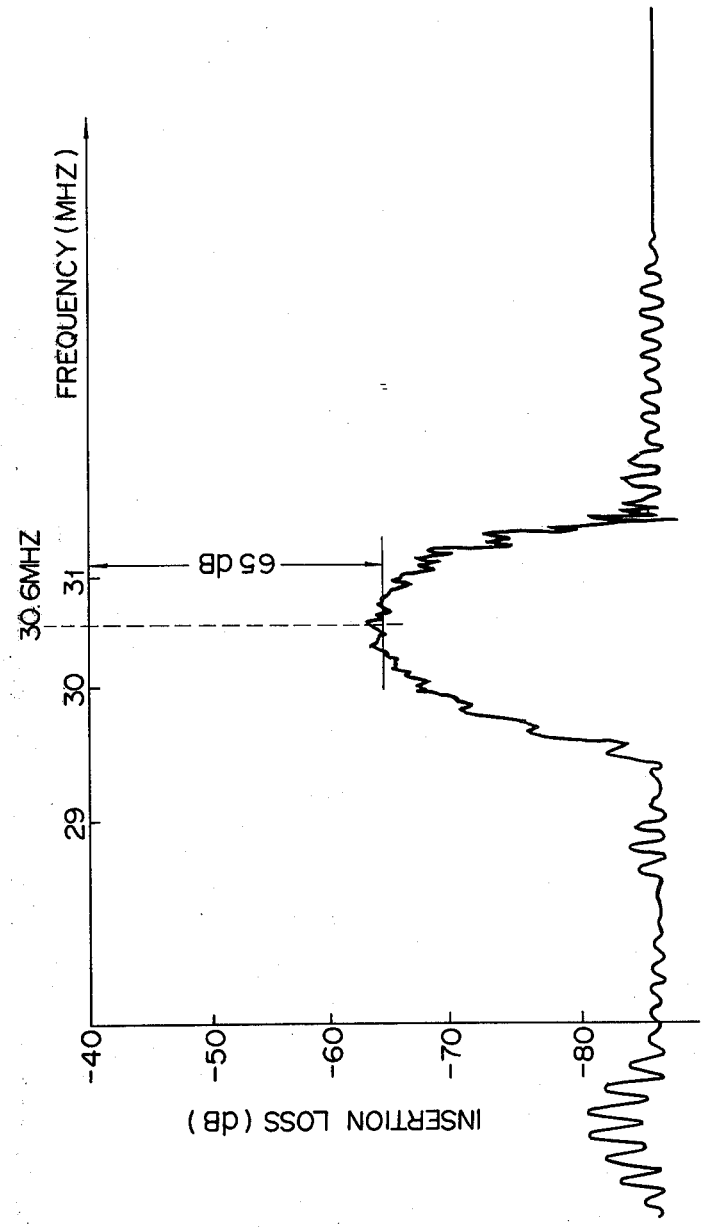
FIG. 4 is a curve diagram of the frequency-insertion loss characteristics of the surface wave apparatus of FIG. 3.

Referring to FIGS. 1 and 2, electricity-surface wave conversion interdigitated electrodes 3, 4 made of chromiumgold alloy are evaporated on the undersides of transparent glass substrates 1, 2 to a thickness of, for example, 300 A. The underside of each glass substrate should preferably be mirror-finished. One electricity-surface wave conversion interdigitated (commonly so called) electrode 3 consists of a pair of comb-shaped electrode units 3a, 3b with the tooth members constituting one of said two electrode units inserted between the corresponding adjacent tooth members of the other electrode unit, and has substantially the same area as the underside of the corresponding glass substrate 1. The other electricity-surface wave conversion interdigitated electrode 4 similarly consists of a pair of comb-shaped electrode units 4a, 4b assembled in the same manner as described above.

Assemblies consisting of the interdigitated electrodes 3, 4 and glass substrates 1, 2 on which said electrodes 3, 4 are formed are turned upside down, and in this state are mounted on the smooth surface of a piezoelectric plate 5 made of, for example, lithium niobate ($LiNbO_3$) at a prescribed space with thin insulation liquid layers 6a, 6b consisting of, for example, demineralized water provided between said assemblies and piezoelectric plate 5. This is the construction of a surface wave apparatus 7 according to an embodiment of this invention. In this case, the surface tension of the insulation liquid layers 6a, 6b enables the interdigitated electrodes 3, 4 to be tightly bonded to the piezoelectric plate 5. The interdigitated electrode 3 is used as an input side electrode of said surface wave apparatus 7 and the interdigitated electrode 4 as an output side electrode.

Since this first embodiment includes the transparent glass substrates 1, 2, the positions of the interdigitated electrodes 3, 4 on the piezoelectric substrate 5 can be distinctly recognized. Accordingly, the interdigitated electrodes 3, 4 are free to be so positioned as to enable the surface wave apparatus 7 to display a maximum electricity-surface wave conversion rate and generate an output little contaminated by a spurious mode. Further since, as described above, the interdigitated electrodes 3, 4 are formed in substantially the same size as the glass insulation substrates 1, 2, the positions of the glass insulation substrates 1, 2 may practically be taken as those of the interdigitated electrodes 3, 4. Even if, therefore, the insulation plates 1, 2 are not transparent, the interdigitated electrodes 3, 4 can be most suitably adjusted in position.

For formation of the insulation liquid layers 6a, 6b, it is advised to immerse the glass substrates 1, 2 on which the interdigitated electrodes 3, 4 are mounted and the piezoelectric plate 5 in the insulation liquid being used and place said electrode-substrate assemblies on the piezoelectric plate 5 as soon as the assemblies are taken out of the liquid. Under this condition, the glass substrates 1, 2 and the piezoelectric plate 5 are supposed to be closely pressed against each other by the surface tension of the insulation liquid layer. Otherwise, it is possible to place the electrode-substrate assemblies on the piezoelectric plate 5 in advance with the interdigitated electrodes 3, 4 loosely pressed against said piezoelectric plate 5 and introduce the insulation liquid between said electrodes 3, 4 and the piezoelectric plate 5. This process enables the interdigitated electrodes 3, 4 to be tightly attached to the piezoelectric plate 5 by the surface tension of the insulation liquid layers 6a, 6b thus provided.

The liquid constituting the insulation liquid layers 6a, 6b may consist of any or combination of demineralized water, methyl alcohol, ethyl alcohol, glycerine, silicone oil and insulation oil. Where the insulation layers 6a, 6b are formed of readily volatilizable liquid such as alcohol, it is advised to cover the side portions of the glass insulation substrates 1, 2 and an interstice between the piezoelectric plate 5 and the respective glass substrates 1, 2 with proper synthetic resin.

As compared with the prior art surface wave apparatus constructed simply by pressing electricity-surface wave conversion electrodes against a piezoelectric plate, the surface wave apparatus of this invention has its electricity-surface wave conversion rate improved as much as about 33 dB where the insulation liquid layer consists of any of alcohol, glycerine and silicone oil, and is substantially free from a spurious mode.

There will now be described by reference to FIG. 3 a surface wave apparatus according to a second embodiment of this invention. In this case, electricity-surface wave conversion interdigitated electrodes 13, 14 are evaporated on piezoelectric plates 11, 12 made of quartz to a thickness of about 3000 A. The interdigitated electrodes 13, 14 are mounted on a transparent lead glass substrate 15 with alcohol layers 16a, 16b inserted between said electrodes 13, 14 and piezoelectric plates 11, 12, thereby providing a surface wave apparatus 17. The quartz piezoelectric plates 11, 12 consist of X-axis cut types so as to allow a surface wave to propagate along said X crystal axis. The electricity-surface wave conversion electrodes 13, 14 are each formed of a pair of interdigitated electrode units. According to the second embodiment of FIG. 3, each interdigitated electrode experimentally had 25 pairs of mutually facing teeth, each tooth having a width of 26 microns. The liquid layers consisted of ethyl alcohol. An input signal to said surface wave apparatus 7 presented an insertion loss shown in FIG. 5 relative to its frequency. A main response having a band width of 1.2 MHz indicated an insertion loss of 56 dB at the 30.6 MHz central frequency of an input signal, proving that said main response was free from a spurious mode. Level variation V occurring in the vertical direction in the rising and falling portions of a main response having a central frequency of 30.6 MHz was determined to be 5 dB/div. Level variation H occurring in the horizontal direction in the intermediate portion of said main response indicated at 0.5 MHz/div.

Figure 5:
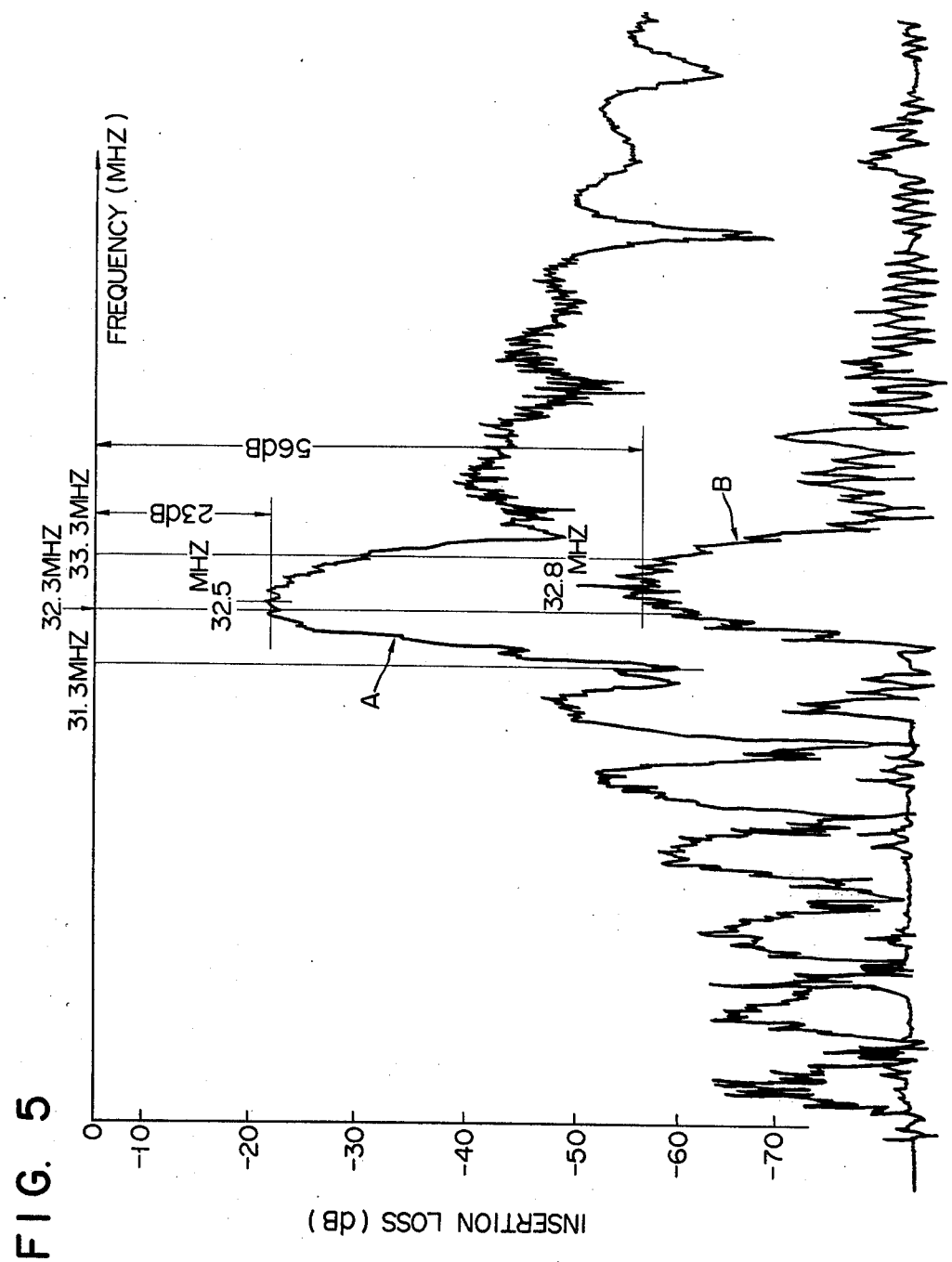
FIGS. 5 and 6 are curve diagrams showing the changes in the frequency-insertion loss which are caused by the different kinds of insulation liquid used.

FIG. 5 gives the result of comparison carried out with respect to the frequency-insertion loss of a main response between a surface wave apparatus according to the second embodiment of FIG. 3 in which the piezoelectric plates 11, 12 were prepared from lithium niobate ($LiNbO_3$) instead of quartz and the interdigitated electrodes 13, 14 and insulation substrate 15 were bonded together by a thin layer of alcohol used as an insulation liquid according to this invention and the prior art surface wave apparatus constructed simply by pressing interdigitated electrodes to the piezoelectric plate. The curve A represents the insertion loss of a main response in the surface wave apparatus of this invention and the curve B denotes that of a main response in the prior art surface wave. As apparent from FIG. 5, the curve A shows that a main response indicated as small an insertion loss as 23 dB at its central frequency of 32.5 MHz, whereas the curve B indicates that a main response presented as large an insertion loss as 56 dB at its central frequency of 32.8 MHz, thus proving that the surface wave apparatus of this invention has the insertion loss of a main response decreased as prominently as 33 dB.

Namely, as determined from the insertion loss of a main response, this invention attains substantially the same electricity-surface wave conversion efficiency as the prior art surface wave apparatus constructed simply by evaporating an electricity-surface wave interdigitated electrode on a piezoelectric plate. This prominent feature of the present invention is supposed to originate with the fact that the electricity-surface wave conversion interdigitated electrodes are tightly pressed against the piezoelectric plate by the surface tension of an insulation liquid layer interposed therebetween.

Figure 6:
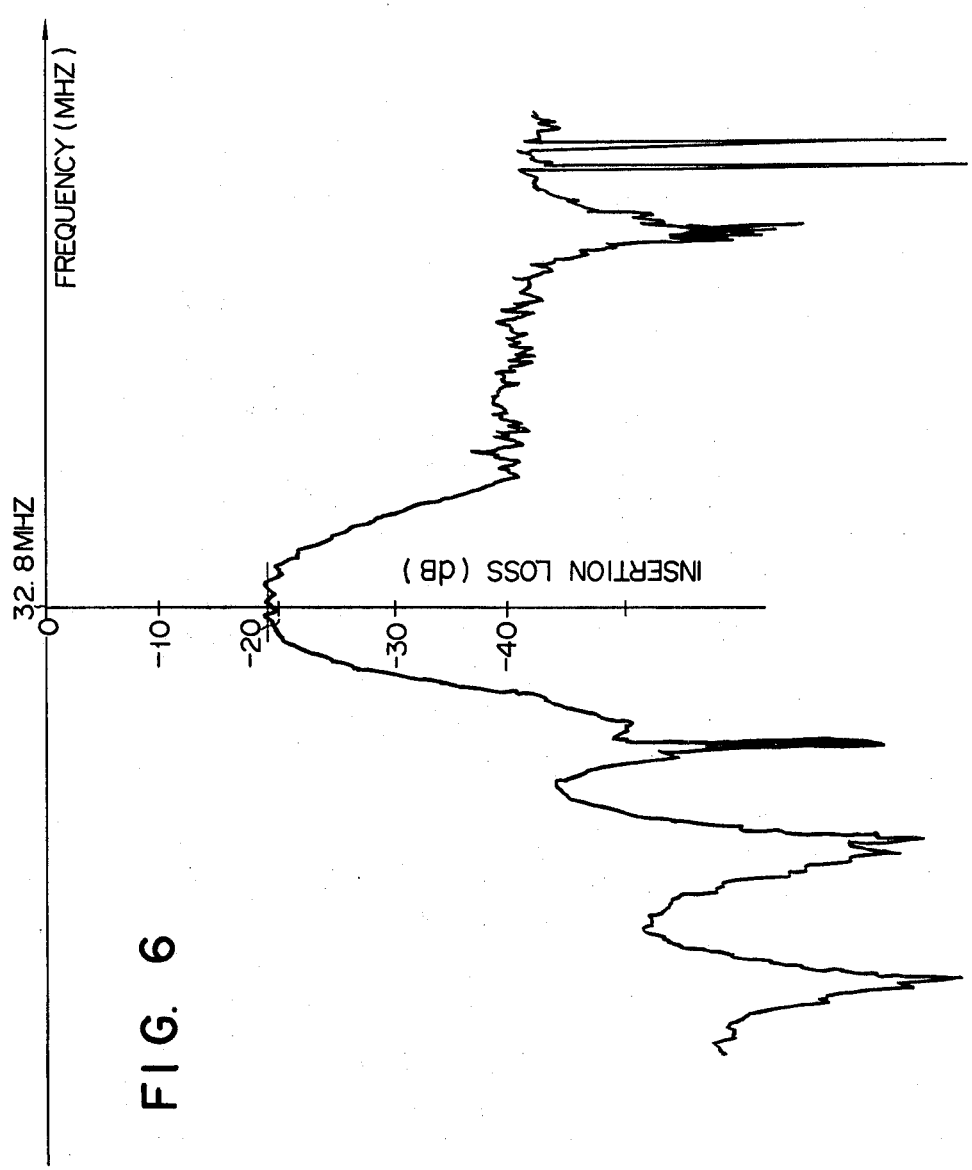

FIG. 6 sets forth the frequency-insertion characteristics of a main response where quartz constituting the piezoelectric plates 11, 12 of the embodiment of FIG. 3 was replaced by lithium niobate ($LiNbO_3$) and alcohol forming the insulation liquid layers was substituted by glycerine. As seen from FIG. 6, the insertion loss of a main response was determined to be as small as 20 dB at its central frequency of 32.8 MHz, showing as prominent an improvement as 36 dB over the 56 dB insertion loss observed in the prior art surface wave apparatus. Where the glycerine was replaced by silicone oil, the insertion loss was improved 30 dB over the prior art.

FIG. 7 shows part of an ultranarrow band filter 21 to which the surface wave apparatus of this invention is applied. The filter 21 is constructed by evaporating on a glass substrate 22 an interdigitated electrode constituted by two comb-shaped electrode units 23a, 23b assembled together such that a plurality of tooth members of one of said electrode units are inserted between the corresponding adjacent tooth members of the other electrode unit and further by mounting a plurality of piezoelectric plates 24-1, 24-2, 24-3, 24-n, for example, on every two pairs of mutually facing electrode tooth members of said electrode units 23a, 23b as illustrated in FIG. 7 with insulation liquid layers provided, as in the preceding embodiments, between the electrode units 23a, 23b and the piezoelectric plates 24-1, 24-2, 24-3, 24-n.

For example, where the band width of a signal passing through any pair of the mutually-facing tooth members of the two electrode units 23a, 23b constituting an interdigitated electrode happens to be 0.1 percent of the total band width of signals transmitted through the entire interdigitated electrode, then each electrode unit will have to be provided with about 1000 tooth members, namely, about 2000 tooth members will be required in all for the filter 21 as a whole. Obviously, a large number of piezoelectric plates 24-1, to 24-n must also be used. However, this invention enables these piezoelectric plates to be easily attached to the substrate 22 by means of an insulation liquid layer, thus providing an ultranarrow filter easy of construction, capable of attaining a very high electricity-surface wave conversion rate and further little contaminated by a spurious mode.

Figure 8A:
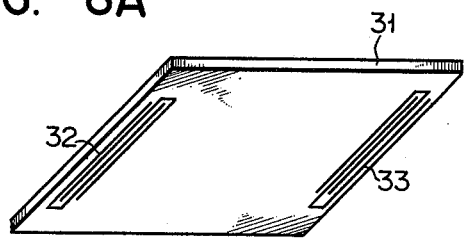
FIGS. 8A and 8B are oblique views showing the sequential steps of manufacturing a surface wave apparatus according to a further embodiment of the invention.
Figure 8B:
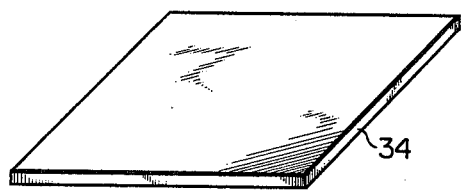

Referring now to FIG. 8A, an input side electricity-surface wave conversion interdigitated electrode 32 and an output side electricity-surface wave conversion interdigitated electrode 33 are spatially fitted to the mirror-finished underside of a nonpiezoelectric insulation member, for example, a glass substrate 31. These input and output side interdigitated electrodes 32, 33 are formed by evaporating, for example, a chromium-gold alloy to a thickness of 3000 Å on the glass substrate 31. The mirror-finished underside of the glass substrate 31 now fitted with said interdigitated electrodes 32, 33 is mounted on the mirror-finished surface of a piezoelectric plate 34 having substantially the same size as the glass substrate 31 as shown in FIG. 8B, with an insulation liquid 35, for example, ethyl alcohol inserted between the interdigitated electrodes 32, 33 and the piezoelectric plate 34, so as to cause said electrodes and piezoelectric plate to be firmly attached to each other by the surface tension of the ethyl alcohol 35, thereby providing the surface wave apparatus 36 of FIG. 9.

Figure 9:
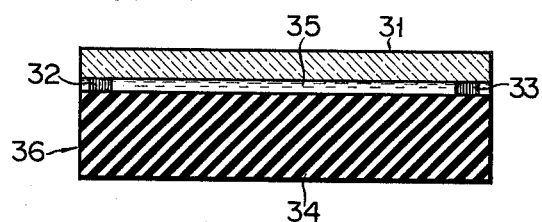
FIG. 9 is a cross sectional view of the surface wave apparatus constructed by the steps of FIGS. 8A and 8B.

Referring to FIG. 9, the piezoelectric plate 34 consists of a piece of lithium niobate ($LiNbO_3$) 40 mm long, 10 mm wide, and 5 mm thick. The interdigitated electrodes 32, 33 are spaced 15 mm from each other, and are each provided with a sufficient number of tooth members to constitute 25 pairs. Determination was made of the relationship between the intrinsic dielectric constant of an insulation liquid used and the insertion loss of a main response, with said insulation liquid changed to other forms than ethyl alcohol, the results being set forth in Table 1 below.

Table 1

| Dielectric Constant and Insertion Loss | | |
|---|---|---|
| Insulation liquid | Dielectric constant ($\epsilon/\epsilon 0$) | Insertion loss (dB) |
| Demineralized water (20° C) | 62.0 | 18 |
| Glycerine (10% wt.) | 43.0 | 20 |
| Ethyl alcohol 20° C) | 4.67 | 23 |
| Silicone oil (2 cp) | 2.6 | 26 |

As apparent from Table 1 above, an insulation liquid having a larger dielectric constant realizes the smaller insertion loss of a main response, providing a surface wave apparatus displaying a higher electricity-surfade wave conversion rate.

Next, determination was also made of the relationship between the surface tension of an insulation liquid and the insertion loss of a main response under the same conditions as in Table 1, the results being given in Table 2 below.

Table 2

| Surface Tension and Insertion Loss | | |
|---|---|---|
| Insulation liquid | Surface tension (dyn/cm) | Insertion Loss (dB) |
| Ethyl alcohol (20° C) | 24 | 21.5 |
| Silicone oil (2 cp) | 18 | 26 |

Table 2 above shows that an insulation liquid having a larger surface tension leads to the smaller insertion loss of a main response.

Figure 10:
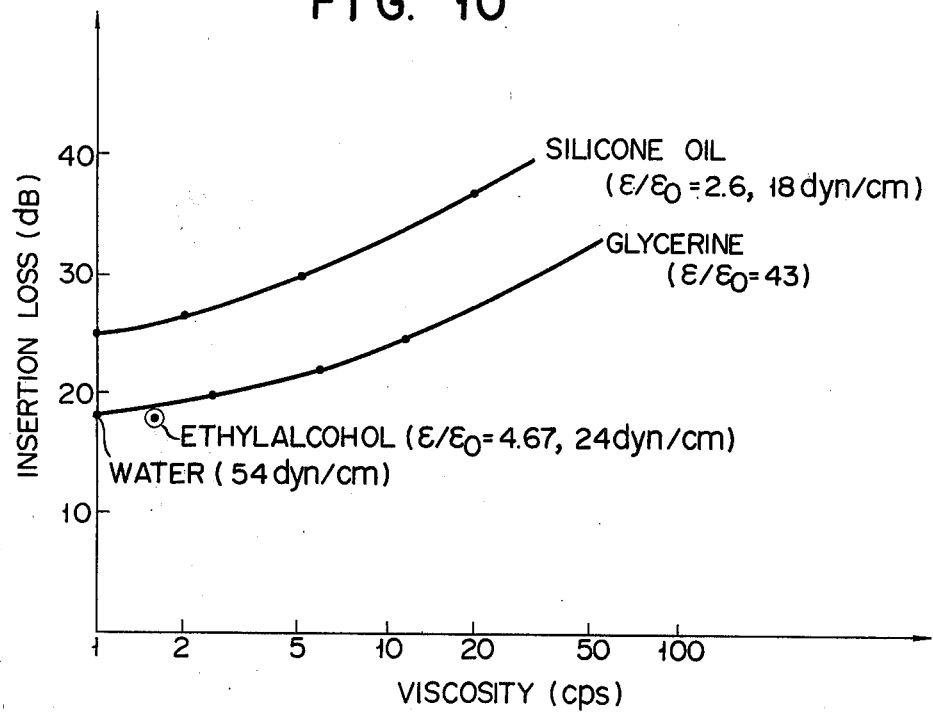
FIG. 10 is a curve diagram showing the changes in the viscosity-insertion loss characteristics which are caused by the different kinds of insulation liquid used.

Determination was further carried out of the relationship between the viscosity of an insulation liquid and the insertion loss of a main response. Under the same conditions as in Table 1, the results being set forth in FIG. 10, which shows that where silicone oil having an intrinsic dielectric constant ($\epsilon/\epsilon o$) of 2.6, a surface tension of 18 dyn/cm and a viscosity of 1 results in as large an insertion loss as 25 dB, whereas glycerine having an intrinsic dielectric constant ($\epsilon/\epsilon o$) of 43.0, and a viscosity of 1 attained as small an insertion loss of about 10 dB. As the viscosity of these insulation liquids increased, the insertion loss rose substantially at the same rate, proving that the smaller viscosity of a insulation liquid can more decrease the insertion loss of a main response. Ethyl alcohol having an inchangeable viscosity of 1.6, intrinsic dielectric constant $\epsilon/\epsilon o$ of 4.67 and surface tension of 24 dyn/cm led to the about 18 dB insertion loss of a main response, while water having a viscosity of 1, intrinsic dielectric constant $\epsilon/\epsilon o$ of 62.0 and surface tension of 54 dyn/cm also indicated the about 18 dB an insertion loss of main response. This shows that an insulation liquid having a smaller viscosity reduces the insertion loss of a main response, namely, a good surface wave apparatus incurring a small insertion loss can be realized by applying an insulation liquid having a smaller viscosity, larger dielectric constant and greater surface tension. Most adapted to meet these conditions are insulation liquids such as demineralized or distilled water, glycerine and alcohol, followed by silicone oil.

The surface wave apparatus of FIG. 9 attains the same effect as the embodiments described with reference to FIGS. 1 to 7. Namely, even where wholly immersed, for example, in cooled silicone oil used for insulation, the surface wave apparatus of FIG. 9 satisfactorily functions. Therefore, the surface wave apparatus thus immersed proves very effective even when used with a circuit handling a large amount of high voltage power. This fact is a noticeable improvement over the prior art surface wave apparatus, which, when immersed in liquid, completely suppressed the propagation of surface waves.

Figure 11:
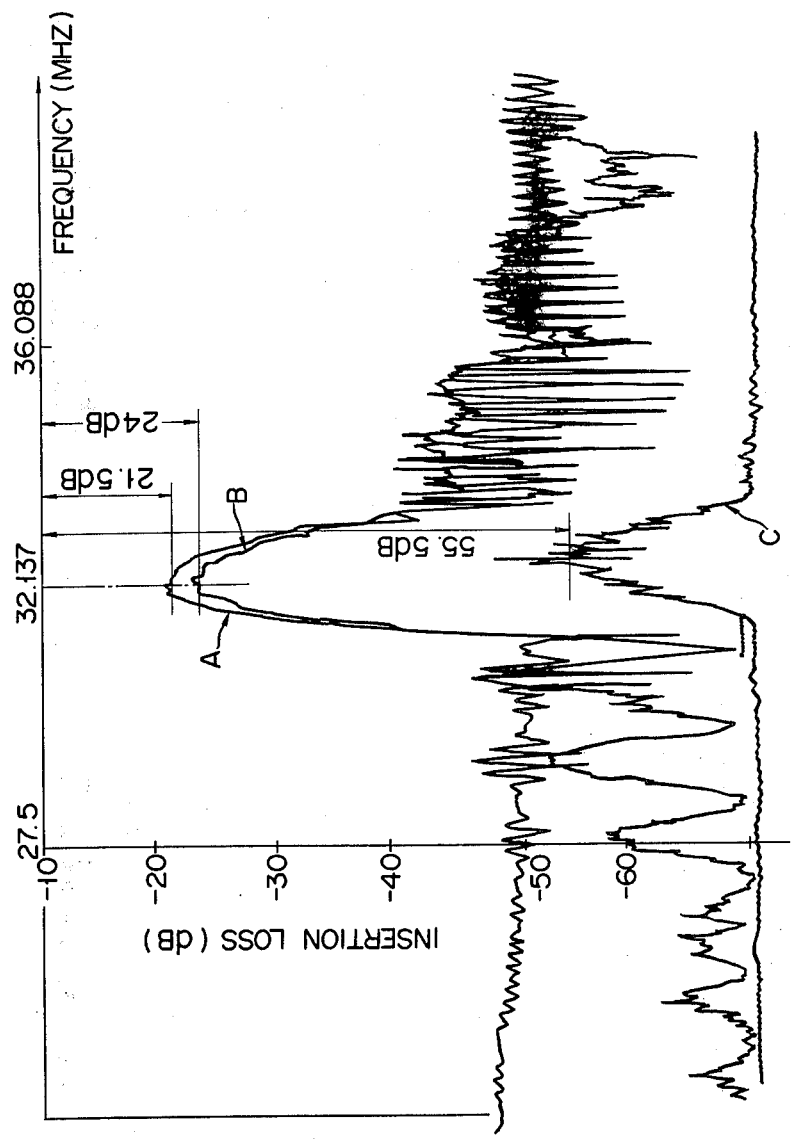
FIG. 11 is a curve diagram indicating the frequency-insertion loss characteristics of the surface wave apparatus of FIG. 9 when it is immersed in water.

There will now be further detailed the properties of the surface wave apparatus of FIG. 9 in comparison with those of the prior art surface wave apparatus. First, where the insulation liquid 35 was formed of silicone oil of 2 cp having an intrinsic dielectric constant $\epsilon/\epsilon o$ of 2.6, then the resultant surface wave apparatus was improved as much as 25 dB, as measured in the air, in the electricity-surface wave conversion rate over the prior art surface wave apparatus. In this case, the silicone oil used as an insulation oil in the surface wave apparatus of this invention had a surface tension of 18 dyn/cm. When immersed in the water, the subject surface wave apparatus of FIG. 9 had its electricity-surface wave conversion rate increased only 3 dB than in the air, proving it could be fully operable even in the water. Further, it was disclosed that where provided with an insulation liquid of ethyl alcohol at 20° C, the surface wave apparatus of this invention had its electricity-surface wave conversion rate improved as much as 33 dB as measured in the air over the prior art surface wave apparatus. The insertion loss of a main response occurring in the subject surface wave apparatus of FIG. 9 was improved with respect to the frequency of an input signal like the embodiment of FIG. 3 as illustrated in FIG. 5.

Where the surface wave apparatus of FIG. 9 whose insulation liquid layer 35 consisted of ethyl alcohol was immersed in insulation oil, silicone oil or alcohol, then the attenuation of surface waves was not substantially observed. Only when placed in the water, said apparatus indicated as small a surface wave attenuation as 2.5 dB, the electricity-surface wave conversion property of said apparatus being shown in the curve diagram of FIG. 11. The curve A denotes said property in the air and the curve B represents said property in the water. Namely, a main response having a 32.137 central frequency indicated an insertion loss of 21.5 dB in the air and 24 dB in the water, proving that the insertion loss was decreased by 2.5 dB in the air. In either case, the subject surface wave apparatus of FIG. 9 was shown to incur a very small insertion loss. The curve C represents the insertion loss in the water of the prior art surface wave apparatus constructed simply by pressing interdigitated electrodes against a piezoelectric plate. As large an insertion loss as 55.5 dB obviously renders the prior art surface wave apparatus quite unavailable in the water.

Figure 12:
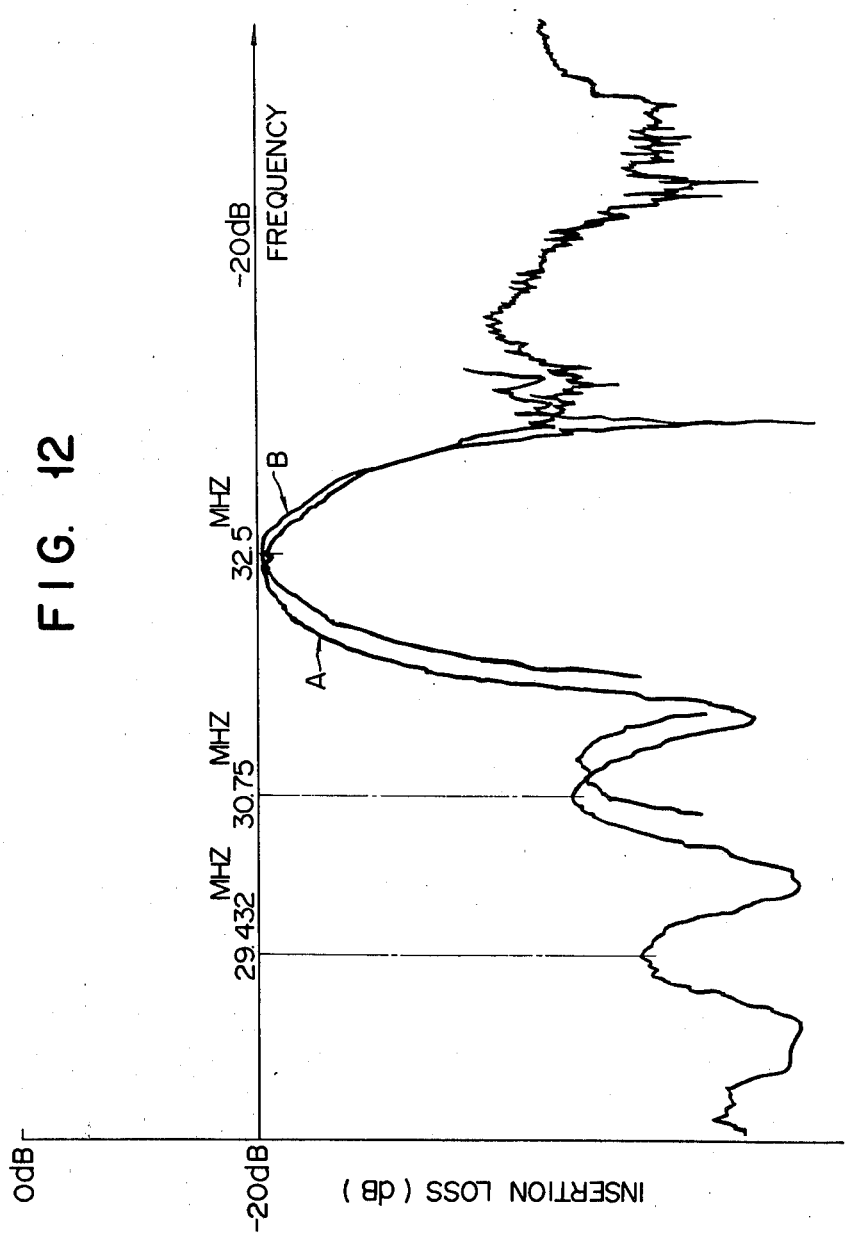
FIG. 12 is a curve diagram presenting changes with time in the frequency-insertion loss characteristics of the surface wave apparatus of FIG. 9 when it is placed in silicone oil.

Further, determination was made of changes with time in the relationship between the frequency and insertion loss of a main response occurring in the subject surface wave apparatus 36 whose insulation liquid layer 35 consisted of ethyl alcohol, when said apparatus 36 was placed in silicone oil of 350 cp having an intrinsic dielectric constant $\epsilon/\epsilon o$ of 2.6, the results being given in FIG. 12. The curve A shows the property of the subject surface wave apparatus 36 immediately after immersed in the silicone oil, and the curve B denotes said property 20 hours after said immersion. What deserves particular notice in the results of the above-mentioned experiments is that no mixture took place between the ethyl alcohol used as the insulation liquid 35 and the silicone oil surrounding the subject surface wave apparatus 36, as far as judged from the curves A and B. This event is supposed to originate with the fact that the insertion loss in the air of the subject surface wave apparatus whose insulation liquid layer 35 was formed of silicone oil having an intrinsic dielectric constant $\epsilon/\epsilon o$ of 2.6 and a surface tension of 18 dyn/cm indicated in the air the insertion loss of a main response amounting to about 26 dB, whereas, in FIG. 12, both insertion losses of said main response represented by the curves A and B were kept at about 20 dB, though said main response had a slightly different peak frequency.

Determination was made of the insertion loss of a main response occurring in the subject surface wave apparatus 36 whose insulation liquid layer 35 was prepared from ethyl alcohol when said apparatus 36 was immersed in silicone oil of 350 cp having an intrinsic dielectric constant of 2.6 and also when placed in demineralized water having an intrinsic dielectric constant of 62, as well as of the electrical coupling of both input side and output side interdigitated electrodes taking place in the above-mentioned two cases, the results of all these experiments being set forth in Table 3 below.

Table 3

| Dielectric Constant and Electrode Coupling | | | |
|---|---|---|---|
| Insulation liquid | Intrinsic dielectric constant ($\epsilon/\epsilon o$) | Insulation loss (dB) | Electrode coupling (dB) |
| Demineralized water | 62 | 2 | 20 |
| Silicone oil | 2.6 | 0 | 0 |

Table 3 above shows that silicone oil having a smaller intrinsic dielectric constant more effectively suppresses electrical coupling between the input side and output side interdigitated electrodes and also more reduces the insertion loss of a main response than demineralized water. Therefore, the surface wave apparatus of this invention immersed in silicone oil can well serve the purpose in a fully cooled and insulated state substantially without any deterioration of property.

Determination was made of the relationship between the input frequency and insertion loss of a main response occurring in the air in the subject surface wave apparatus of FIG. 9 whose insulation liquid layer was formed of glycerine having an intrinsic dielectric constant $\epsilon/\epsilon_o$ of 43 and viscosity of 2.5, showing that the main response incurred an insertion loss of about 20 dB at its 32.8 MHz central frequency like the embodiment of FIG. 3 as illustrated in FIG. 6. Where determination was made of the above-mentioned relationship observed in the subject surface wave apparatus whose insulation liquid layer consisted of demineralized water, then the insertion loss of the main response was 18 dB at the same central frequency, though measured data are not shown.

Figure 13:
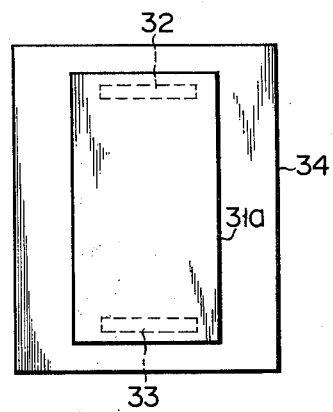
FIGS. 13 to 16 are plan views of many other embodiments of the surface wave apparatus of the invention.
Figure 14:
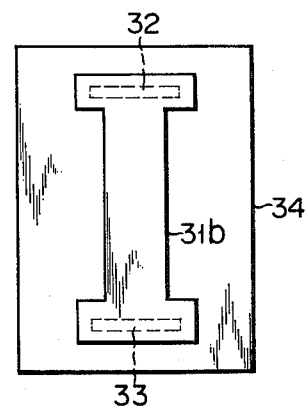
Figure 15:
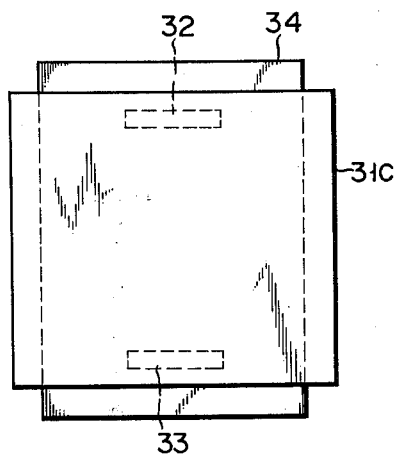
Figure 16:
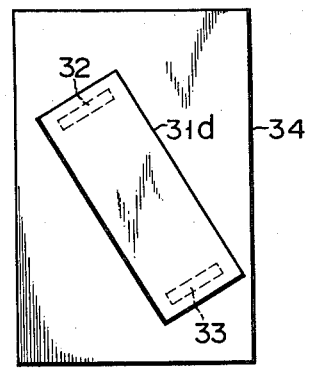

Though, according to FIG. 9, the glass substrate 31 and piezoelectric plate 34 have substantially the same size, this invention is not restricted thereby at all. Namely, it is possible to mount on a rectangular piezoelectric plate 34 a smaller substrate 31a of similar shape as illustrated, for example, in FIG. 13. Or as shown in FIG. 14, the rectangular substrate 31a of FIG. 13 may be replaced by an I-shaped substrate 31b whose intermediate portion allowing the propagation of a surface wave is made narrower than the end portions on which the interdigitated electrodes 32, 33 are formed. Further, as seen from FIG. 15, it is possible to use a square substrate 31c, each side of which is broader than the width of the rectangular piezoelectric plate 34. Or as set forth in FIG. 16, a rectangular substrate 31d may be obliquely positioned relative to the lengthwise direction of the rectangular piezoelectric plate 34 so as to realize the oblique propagation of a surface wave.

What is claimed is:

1. A surface wave apparatus which comprises an electrical insulation substrate having a smooth surface; at least two first and second electricity-surface wave conversion interdigitated electrodes formed at a prescribed space on the smooth surface of the insulation substrate; a single piezoelectric plate mounted on the insulation substrate so as to wholly cover both the first and second electricity-surface wave conversion interdigitated electrodes and the intervening space; and an insulation liquid layer provided between the piezoelectric plate and the insulation substrate.

2. A surface wave apparatus according to claim 1, wherein the smooth surface of the insulation substrate is mirror-finished.

3. A surface wave apparatus according to claim 1, wherein the insulation liquid layer is formed of a material selected from the group consisting of water, alcohol, glycerine, silicone oil and insulation oil and any combination thereof.

4. A surface wave apparatus according to claim 1, wherein the piezoelectric plate consists of first and second broad end portions facing the first and second electricity-surface wave conversion interdigitated electrodes and an intermediate narrow portion extending between the first and second broad end portions.

5. A surface wave apparatus according to claim 1, wherein the insulation substrate is rectangular and the piezoelectric plate is also rectangular and is obliquely positioned relative to the lengthwise direction of the rectangular substrate.

6. A surface wave apparatus according to claim 1, wherein the insulation substrate is a square, each side of which is broader than the width of the rectangular piezoelectric plate.

* * * * *